United States Patent
Sudo et al.

(10) Patent No.: US 8,922,410 B2
(45) Date of Patent: Dec. 30, 2014

(54) OPTICAL INTENSITY-TO-PHASE CONVERTER, MACH-ZEHNDER INTERFEROMETER, OPTICAL A/D CONVERTER, AND METHOD OF CONSTRUCTING OPTICAL INTENSITY-TO-PHASE CONVERTER

(75) Inventors: Shinya Sudo, Tokyo (JP); Kenji Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 17 days.

(21) Appl. No.: 13/698,019

(22) PCT Filed: Apr. 28, 2011

(86) PCT No.: PCT/JP2011/002505
§ 371 (c)(1),
(2), (4) Date: Jan. 4, 2013

(87) PCT Pub. No.: WO2011/145280
PCT Pub. Date: Nov. 24, 2011

(65) Prior Publication Data
US 2013/0113641 A1 May 9, 2013

(30) Foreign Application Priority Data

May 19, 2010 (JP) .................. 2010-115545

(51) Int. Cl.
| | |
|---|---|
| H03M 1/12 | (2006.01) |
| G02F 1/01 | (2006.01) |
| G02F 1/225 | (2006.01) |
| G02F 7/00 | (2006.01) |

(52) U.S. Cl.
CPC ............... *G02F 1/011* (2013.01); *H03M 1/12* (2013.01); *G02F 1/225* (2013.01); *G02F 7/00* (2013.01)
USPC ............................... 341/137; 341/155

(58) Field of Classification Search
CPC ............ G02F 7/00; G02F 1/011; G02F 1/225
USPC ...................................... 341/137, 155
See application file for complete search history.

(56) References Cited

U.S. PATENT DOCUMENTS

| | | |
|---|---|---|
| 4,947,170 A | 8/1990 | Falk |
| 5,933,554 A | 8/1999 | Leuthold et al. |

(Continued)

FOREIGN PATENT DOCUMENTS

| | | |
|---|---|---|
| JP | 61-203566 U | 12/1986 |
| JP | 64-56426 A | 3/1989 |

(Continued)

OTHER PUBLICATIONS

International Search Report (ISR) (PCT Form PCT/ISA/210) dated Jun. 7, 2011, in PCT/JP2011/002505.

(Continued)

*Primary Examiner* — Khai M Nguyen
(74) *Attorney, Agent, or Firm* — McGinn IP Law Group, PLLC

(57) ABSTRACT

An optical intensity-to-phase converter according to the present invention includes first and second waveguides to which a first input light is input, a third waveguide to which a second input light is input, and an interaction region that is provided in common on the second and third waveguides in which the first and second input lights are multiplexed and interact. The optical intensity-to-phase converter provides delay to output lights output from the first and second waveguides based on intensity of the first or second input light. Then, it is possible to provide an optical intensity-to-phase converter that enables simple configuration of an optical A/D converter.

11 Claims, 14 Drawing Sheets

(56) References Cited

U.S. PATENT DOCUMENTS

| | | |
|---|---|---|
| 6,118,397 A | 9/2000 | Heflinger |
| 6,292,119 B1 | 9/2001 | Carillo, Jr. et al. |
| 6,760,524 B2 * | 7/2004 | Mukai .................. 385/122 |
| 7,423,564 B2 | 9/2008 | Kitayama et al. |
| 7,564,387 B1 | 7/2009 | Vawter et al. |
| 7,570,184 B2 * | 8/2009 | Ikeda et al. .................. 341/137 |
| 7,801,451 B2 | 9/2010 | Tsuchida et al. |
| 8,265,489 B2 | 9/2012 | Kikuchi |

FOREIGN PATENT DOCUMENTS

| | | |
|---|---|---|
| JP | 11-502634 A | 3/1999 |
| JP | 2001-51314 | 2/2001 |
| JP | 2001-264709 A | 9/2001 |
| JP | 2003-295246 A | 10/2003 |
| JP | 2004-61889 A | 2/2004 |
| JP | 2005-173530 A | 6/2005 |
| JP | 2006-276095 A | 10/2006 |
| JP | 2007-24924 A | 2/2007 |
| JP | 2008-52066 A | 3/2008 |
| JP | 2008-209775 A | 9/2008 |
| JP | 2010-26458 A | 2/2010 |
| WO | WO 2009/060920 A1 | 5/2009 |

OTHER PUBLICATIONS

U.S. Office Action dated Sep. 30, 2014, issued in U.S. Appl. No. 13/698,018.

* cited by examiner

OPTICAL INTENSITY-TO-PHASE CONVERTER, MACH-ZEHNDER INTERFEROMETER, OPTICAL A/D CONVERTER, AND METHOD OF CONSTRUCTING OPTICAL INTENSITY-TO-PHASE CONVERTER

TECHNICAL FIELD

The present invention relates to an optical intensity-to-phase converter, a Mach-Zehnder interferometer using thereof, an optical A/D converter, and a method of constructing the optical intensity-to-phase converter.

BACKGROUND ART

Improvement in the speed and increase in the capacity by wavelength division multiplexing is further progressing in the optical communication system in intermediate and long distances. The current main optical communication system uses wavelength division multiplex communication with determined wavelength channel spacing. Therefore, with 50 GHz spacing in the band of an optical fiber amplifier, approximately 100 channels can be used.

When the channel spacing is $\Delta f$[Hz] and the transmission rate is B[bit/s], B/$\Delta f$ [bit/s/Hz] shall be spectral efficiency. When $\Delta f$=50 GHz and the transmission rate is 100 Gbit/s for each channel, the spectral efficiency will be 2 bit/s/Hz.

As the band of the optical fiber amplifier is limited, it is necessary to improve the spectral efficiency. However, simply increasing the bit rate of a signal in order to improve the spectral efficiency raises a problem of interchannel crosstalk. Thus, study on optical multi-level modulation and optical OFDM (Orthogonal Frequency-Division Multiplexing) has been progressing as a next generation optical communication system. The optical multi-level modulation is a method to increase the amount of information by multi-leveling using an amplitude and a phase of a light without increasing the spectral band unlike optical intensity modulation of a related art using two values of 0 and 1. Moreover, in the optical OFDM, an OFDM signal is generated by an electrical signal and is optically modulated, and optical subcarriers are set in an orthogonal state to multiplex. This solves the crosstalk problem, thereby improves the spectral efficiency.

An optical signal with multi-leveling and multiplexing mainly involving electrical signal processing in this way is transmitted and demodulated into an electrical signal by a receiver. An analog-to-digital (A/D) converter is required in the subsequent stage of a PD (photodiode) of an optical demodulation circuit. Currently, an A/D converter using an electrical circuit is commonly used.

On the other hand, there are many proposals for the optical A/D converter that directly derives analog quantity of an optical signal as a digital value because of the feature of rapidity included therein. For example, Patent Literature 1 splits an optical signal by different predetermined split ratios to represent the amount of a light by a predetermined ratio and detects an optical analog quantity of the input optical signal by evaluating whether each split optical signal reaches a threshold.

Further, Patent literature 2 composes in optical A/D conversion means a feedback system through a nonlinear optical element for an input optical signal, which is an analog signal, and thus a first output light, which is a digital signal, is sequentially obtained from the optical A/D conversion means.

In Patent Literature 3, an optical coding circuit optically codes pulse trains of a signal light having a first wavelength according to a control light, which is pulse trains of light analog signal having a nearby second wavelength different from the first wavelength and is optically sampled, by a plurality of optical coders provided with optical nonlinear elements having periodic characteristics whose input and output characteristics regarding optical intensity are different, and outputs the pulse trains of the plurality of optically coded signal lights from each optical coder. Then, an optical quantization circuit outputs pulse trains of a carrier light having a nearby third wavelength that is different from the first wavelength as an optical digital signal after conducting optical threshold processing according to the pulse trains of the plurality of optically coded signal lights and optical quantization using a plurality of optical threshold processing devices provided with optical nonlinear elements which are respectively connected to each optical coder and have periodic input and output characteristics regarding the optical intensity.

Patent Literature 4 is characterized in that a plurality of interference optical modulators are included, a photovoltaic element is formed on the same substrate, and an output voltage of this photovoltaic element is applied on the interference optical modulators. Therefore, in this example, a PD receives an intensity signal light once and converts the intensity signal light into a voltage signal, thereby determining the speed of the entire circuit by the speed of this electrical signal.

Patent Literature 5 discloses a logic holding and logic inverting signal light generator that uses an optical signal turned on or off for converting the signal into a delay signal. Patent Literature 6 discloses a device that uses a modulation signal of delay between lights for removing a control light by a filter.

CITATION LIST

Patent Literature

Patent Literature 1: Japanese Unexamined Patent Application Publication No. 2007-24924

Patent Literature 2: Japanese Unexamined Patent Application Publication No. 1-56426

Patent Literature 3: Japanese Unexamined Patent Application Publication No. 2005-173530

Patent Literature 4: Japanese Utility Model No. 61-203566

Patent Literature 5: Japanese Unexamined Patent Application Publication No. 2006-276095

Patent Literature 6: Japanese Unexamined Patent Application Publication No. 2008-052066

SUMMARY OF INVENTION

Technical Problem

In order to realize an optical A/D converter, the configuration thereof is considered to have been complicated due to the difficulty of subtracting a light with given intensity from a light with some intensity. In order to enable simple configuration of this optical A/D converter, it can be considered to use a Mach-Zehnder interferometer that uses phase information of a light. This requires means for efficiently converting optical intensity into the size of optical delay (hereinafter a device realizing this means is referred to as an optical intensity-to-phase converter).

The present invention is made in view of the above circumstances, and its object is to provide an optical intensity-to-phase converter that enables simple configuration of an optical A/D converter.

Solution to Problem

An optical intensity-to-phase converter according to the present invention includes:
first and second waveguides to which a first input light is input, a third waveguide to which a second input light is input, and
an interaction region that is provided in common on the second and third waveguides in which the first and second input lights are multiplexed and interact, in which
the optical intensity-to-phase converter provides delay to output lights output from the first and second waveguides based on intensity of the first or second input light.

A construction method of an optical intensity-to-phase converter according to the present invention includes:
providing first and second waveguides to which a first input light is input,
providing a third waveguide to which a second input light is input,
providing an interaction region in common to the second and third waveguides, in which the first and second input lights are multiplexed and interact, and
providing delay to output lights output from the first and second waveguides based on intensity of the first or second input light.

Advantageous Effects of Invention

According to the present invention, it is possible to provide an optical intensity-to-phase converter that enables simple configuration of an optical A/D converter.

DESCRIPTION OF EMBODIMENTS

Hereinafter, specific exemplary embodiments incorporating the present invention are explained in detail with reference to the drawings. However, the present invention is not necessarily limited to the following exemplary embodiments. Moreover, the following explanation and drawings are simplified as appropriate for clarity of the explanation.

First Exemplary Embodiment

Figure 1:
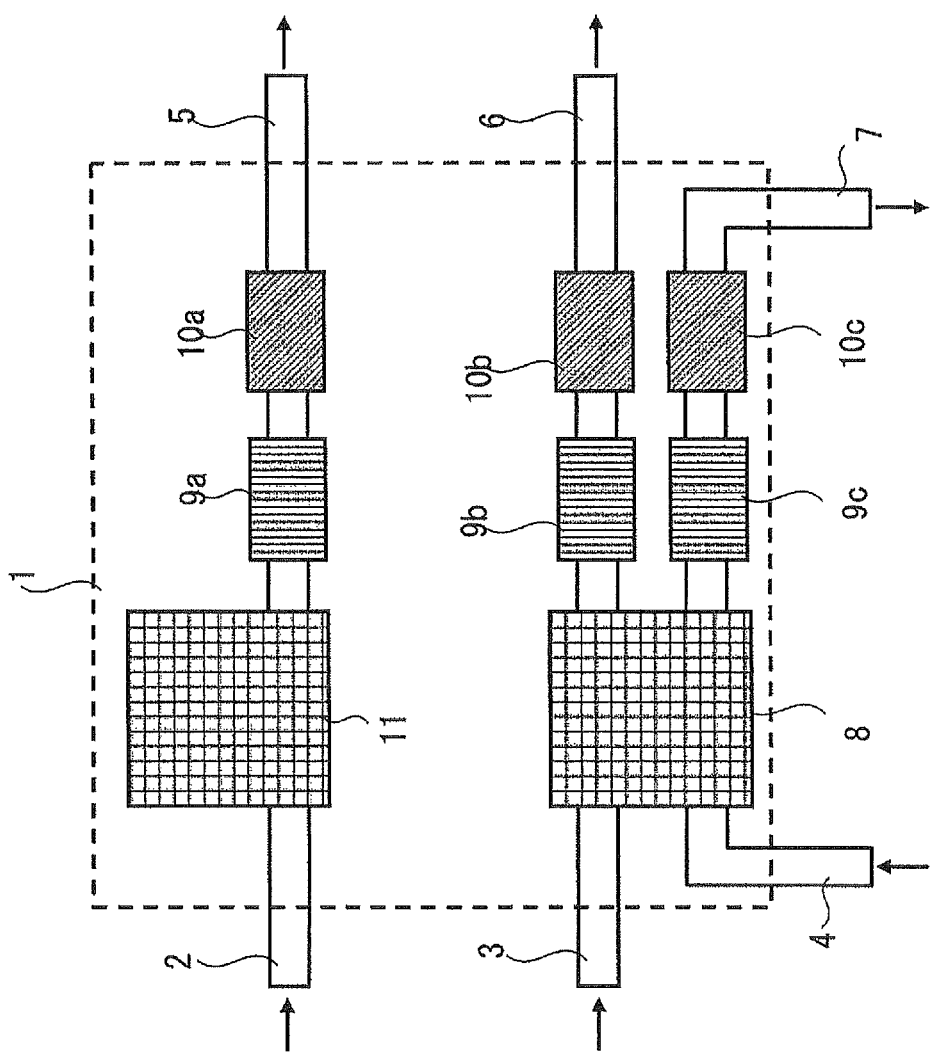
FIG. 1 is a block diagram of an optical intensity-to-phase converter according to a first exemplary embodiment.

FIG. 1 is a block diagram of an optical intensity-to-phase converter according to a first exemplary embodiment. The optical intensity-to-phase converter converts information on optical intensity into information on delay. As shown in FIG. 1, this optical intensity-to-phase converter 1 includes an optical coupler/splitter 8 having two inputs and two outputs that is connected to two input ports 3 and 4 and two output ports 6 and 7, an optical coupler/splitter 11 that is connected to the input port 2 and the output port 5, optical intensity adjusters 9a, 9b, and 9c, optical phase adjusters 10a, 10b, and 10c, and optical waveguides that connect them. In FIG. 1, all of the optical coupler/splitter, the optical intensity adjuster, and the optical phase adjuster are provided to each of three paths (first to third waveguides). However, the optical coupler/splitter 11, the optical intensity adjusters 9a, 9b, and 9c, and the optical phase adjusters 10a, 10b, and 10c are not necessary.

The optical coupler/splitter 8 is an optical circuit with two inputs and two outputs. Phases of lights input to the input port 3 and the input port 4 are shifted in the optical coupler/splitter 8, which is an interaction region, by optical cross-phase modulation. Values such as the width and length of the optical coupler/splitter are designed so that the amount of phase shift will be a desirable value. The optical cross-phase modulation is explained later. Further, it is preferable to design in a manner that when a light is input only from the input port 3, the light is output only from the output port 6, and a light input from the input port 4 is output to the output port 7, which eliminates the need for separating lights by an optical filter and the like in the subsequent stage.

The structure is introduced to the optical coupler/splitter 8 that enables current injection or voltage application. For example, the optical coupler/splitter 8 is a semiconductor waveguide having a pin structure, and electrodes are disposed to allow current or voltage to be applied.

The optical coupler/splitter 8 should use an MMI (Multi Mode Interference) waveguide with two inputs and two outputs as shown in FIG. 1, for example. In that case, adjusting the width and length of the MMI waveguide enables the design in a manner that when a light is input only from the input port 3, the light is output only from the output port 6. In this case, a light input from the input port 4 is output to the output port 7. There are a number of lengths on a periodic basis in which a light input from one input port (for example, 3) is output only to either one of the output ports (for example, 6) for a certain width of the MMI waveguide. Then, the set of the width and length of the MMI waveguide is determined so that the amount of phase shift by the optical cross-phase modulation caused in the MMI waveguide will be a desirable value.

It is still possible to introduce the structure to enable current injection or voltage application even in the case of using the MMI waveguide as the optical coupler/splitter 8. In order to cause a large cross-phase modulation function, a bandgap wavelength included in the MMI waveguide is designed to be close to a wavelength of a light to use in order to obtain an optical amplification function by current injection.

The optical intensity adjusters 9a, 9b, and 9c and the optical phase adjusters 10a, 10b, and 10c are devices for respectively adjusting intensity and phases of lights output from the optical coupler/splitter 8 after the cross-phase modulation and a light output from the optical coupler/splitter 11 without the cross-phase modulation. For example, when the signal optical intensity input from the input port 4 is minimum optical intensity, the optical intensity adjusters 9a, 9b, and 9c are adjusted in advance so that the intensity of lights output from the output port 5 and the output port 6 will be the same. Further, it is desirable to make adjustments so that each input port and its corresponding output port have the same optical intensity. This facilitates cascade connection of the optical intensity-to-phase converters 1. Moreover, the optical phase adjusters 10a, 10b, and 10c are adjusted to have no delay between the output port 5 and the output port 6 when signal optical intensity input from the input port 4 is minimum optical intensity.

A semiconductor optical amplifier can be used as the optical intensity adjusters 9a, 9b, and 9c, for example. Although the optical intensity can be changed in a short distance with the semiconductor optical amplifier, this often causes rotation of the phase of a light at the same time.

Therefore, the optical phase adjusters 10a, 10b, and 10c are required separately. A semiconductor phase modulator can be used as the optical phase adjusters 10a, 10b, and 10c, for example. By reducing the wavelength of a light that uses the bandgap wavelength included in the semiconductor phase modulator by 100 to 200 nm, for example in the case of 1.55 μm band, it is possible to change the phase without hardly changing the intensity of the light.

Moreover, when the lights transmitting from the input ports 3 and 4 to the output ports 6 and 7 undergo optical amplification by the optical coupler/splitter 8 and the intensity of the lights largely changes, the optical intensity adjusters 9a, 9b, and 9c, the optical phase adjusters 10a, 10b, and 10c in the subsequent stages may fail to make adjustments. Therefore, it is desirable to let the light transmit through the optical coupler/splitter 11 which has the same structure as the optical coupler/splitter 8. Note that the optical couplers/splitters 8 and 11 are illustrated to have two inputs and two outputs as an example, though it may be one output and two outputs. Although the amount of phase shift of each port to be output differs depending on the structure of the MMI waveguide, the operation of the optical phase adjusters 10a, 10b, 10c should be configured accordingly.

Next, an operating principle is explained. Well-known optical cross-phase modulation (XPM: Cross-Phase Modulation) is used for phase modulation. Then, an optical intensity change is converted into an optical phase change. The optical couplers/splitters 8 and 11 have the structure to include the functions of an optical coupler, a semiconductor optical waveguide, and an optical splitter. In the optical coupler/splitter 8, lights input from the two input ports 3 and 4 propagate under mutual influence through the same waveguide inside the optical coupler/splitter 8, but is configured to be separated at the exit. This eliminates the need to reseperate the lights according to the wavelength in the subsequent stage, and therefore realizes a simple and small size splitter.

On the other hand, as there is only one input for the light transmitting from the input port 2 to the output port 5 through the optical coupler/splitter 11, it is not subject to the cross-phase modulation. Therefore, delay is generated in the light transmitting from the input port 2 to the output port 5 that is influenced by the light transmitting from the input port 4 to the output port 7 as compared to the light transmitting from the input port 3 to the output port 6.

Note that it is possible to design in a manner that the light input from the input port 3 transmits to the output port 7. In that case, the light input from the input port 4 is output to the output port 6. This structure can be used unless a problem arises on the structure of the elements.

Second Exemplary Embodiment

Figure 2:
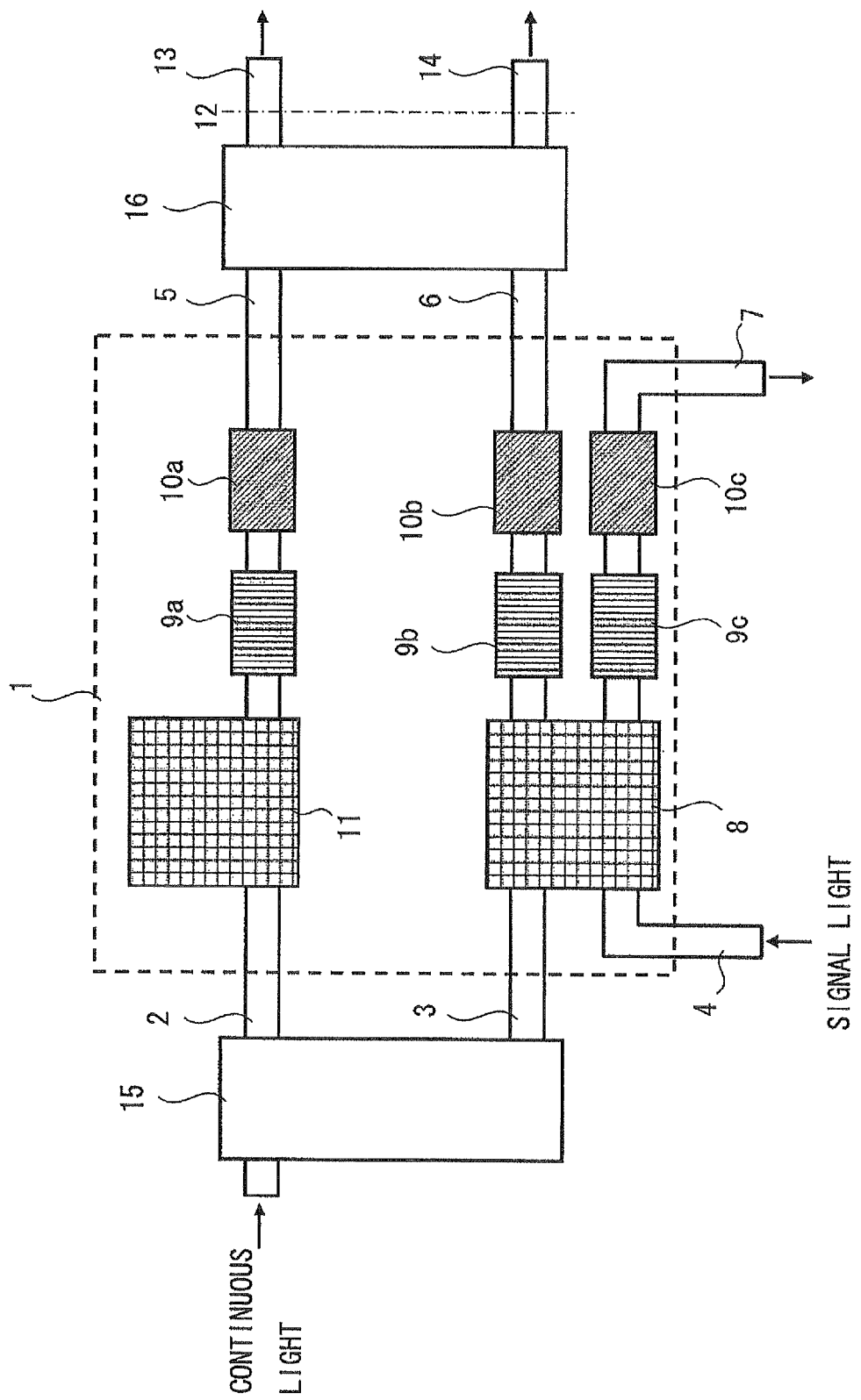
FIG. 2 is a block diagram of an MZ interferometer according to a second exemplary embodiment.

Next, a second exemplary embodiment is explained with reference to FIG. 2. FIG. 2 is a block diagram of an MZ interferometer according to the second exemplary embodiment and is an example of incorporating the optical intensity-to-phase converter 1 in FIG. 1 to the MZ interferometer. Note that in addition to the optical intensity-to-phase converter 1 in FIG. 1, this MZ interferometer includes an optical splitter 15 and an optical coupler/splitter 16. The same components as those in FIG. 1 are denoted by the same reference numerals, and the explanation is omitted as appropriate.

First, a continuous light is introduced into the optical splitter 15 as a local light and split into two. Although the optical splitter 15 in FIG. 2 uses the MMI waveguide with two inputs and two outputs, other means may be used such as the MMI waveguide with one input and two inputs or an optical directional coupler. In this case, an absolute value of the amount of phase shift for each port to be output may be different from the case of the MMI waveguide with two inputs and two outputs, through a change in correlation is similar to the case of the MMI waveguide with two inputs and two outputs. Two outputs of the optical splitter 15 are respectively coupled to the input ports 2 and 3 of the optical intensity-to-phase converter 1. That is, each of the continuous light split into two is respectively introduced to the input ports 2 and 3. On the other hand, a signal light is input in the input port 4.

As mentioned above, the optical cross-phase modulation occurs in the optical coupler/splitter 8, and the phase of the continuous light changes accordingly. On the other hand, no optical cross-phase modulation occurs in the optical coupler/splitter 11, and thus the phase of the continuous light does not change. Therefore, delay is generated between the continuous light passing through the optical coupler/splitter 8 and the continuous light passing through the optical coupler/splitter 11. This delay changes according to the intensity of the input signal light.

As mentioned above, the optical couplers/splitters 8 and 11 are waveguides having the same parameters (width, length, and the like). As for the optical coupler/splitter 11 with two inputs and two outputs, a light is input to only one of the two input ports, which is the input port 2, and no light is input to the other input port (not shown). As for the optical coupler/splitter 8, all the light input from the input port 3 is output to the output port 6. Specifically, when the MMI waveguide is used for the optical couplers/splitters 8 and 11, the width and length of the MMI waveguide are determined. Appropriate width and length of the MMI waveguide, which is the optical coupler/splitter 8, are selected in order to realize meaningful phase rotation with a desired current injection value while satisfying the condition that "all the light input from the input port 3 is output from the output port 6".

As for the optical intensity adjusters 9a, 9b, and 9c, the amount of current injection value is adjusted in advance so that the optical intensity of the output port 5 and the output port 6 will be the same. Moreover, the optical phase adjusters 10a, 10b, and 10c are adjusted so that the optical intensity of the output port 13 of the optical coupler/splitter 16 will be minimum when the signal light input to the input port 4 is minimum optical intensity (often corresponds to the case with no signal light input). That is, it is adjusted so that there is no delay between the light transmitting from the input port 2 to the output port 5 and the light transmitting from the input port 3 through the output port 6.

Figure 3:
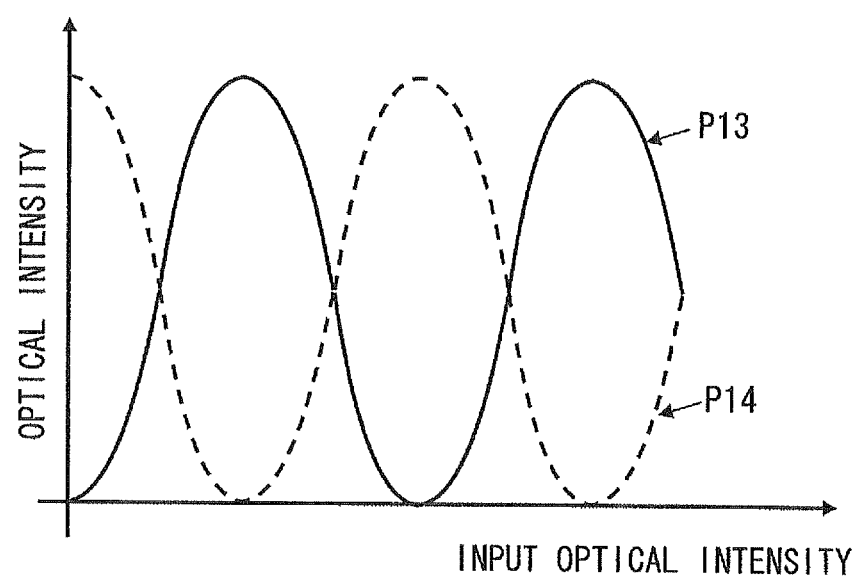
FIG. 3 is a diagram showing optical intensity on a cross-section 12 in FIG. 2.

In the MZ interferometer designed as explained above, optical intensity P13 of the output port 13 and the optical intensity P14 of the output port 14 on the cross-section 12 change according to the signal light intensity input from the input port 4. FIG. 3 is a diagram showing changes in the optical intensity P13 and P14 to input optical intensity (intensity of the input signal light) on the cross-section 12 in FIG. 2. The optical intensity P13 and P14 change symmetrically according to the input optical intensity. Specifically, when the optical intensity P13 is at its maximum, the optical intensity P14 will be at its minimum, whereas when the optical intensity P13 is at its minimum, the optical intensity P14 will be at its maximum. In the MZ interferometer of FIG. 2, since the intensity of the input continuous light is constant, P13+P14=constant is satisfied.

Third Exemplary Embodiment

Figure 4:
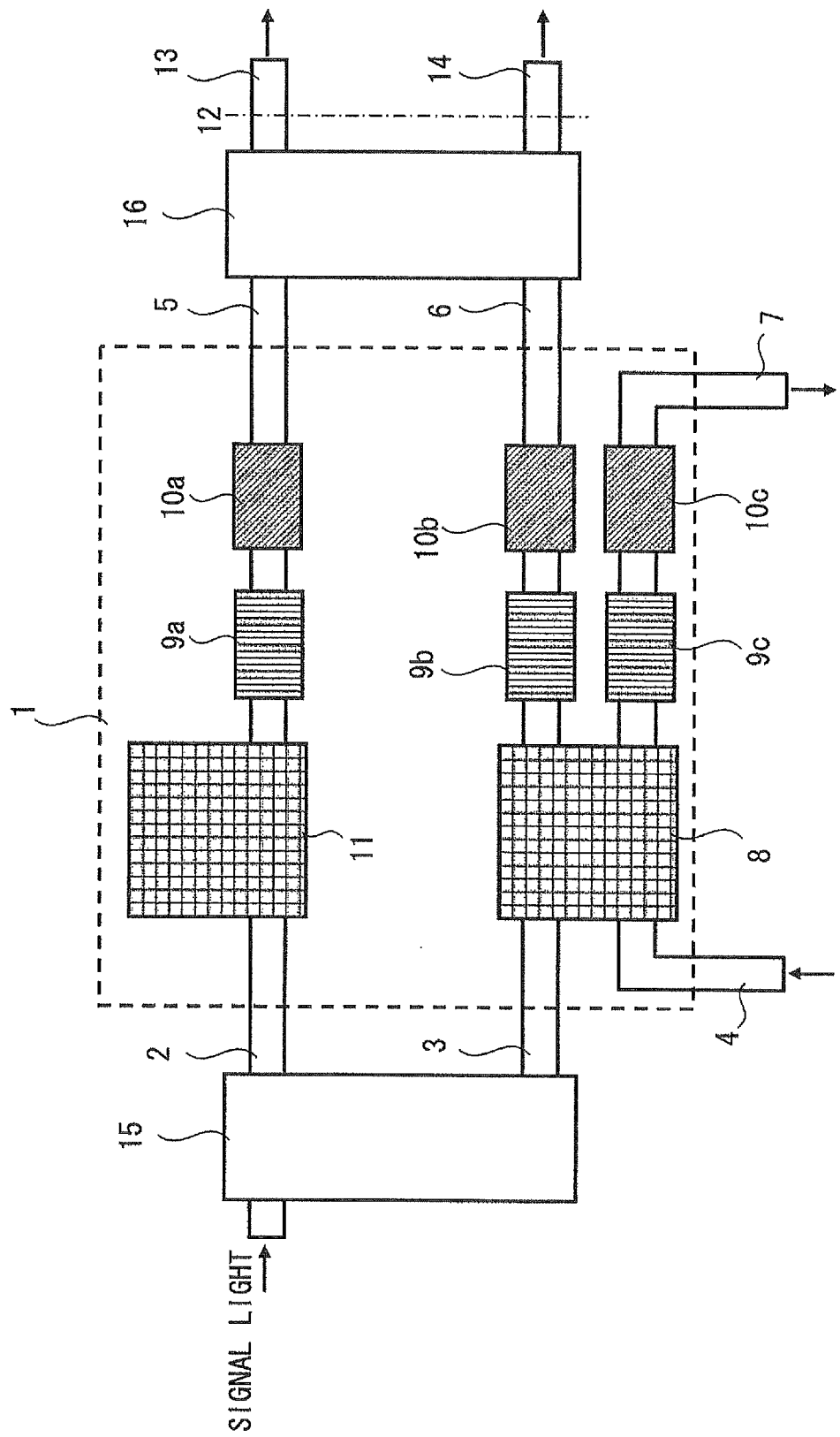
FIG. 4 is a block diagram of an MZ interferometer according to a third exemplary embodiment.
Figure 5:
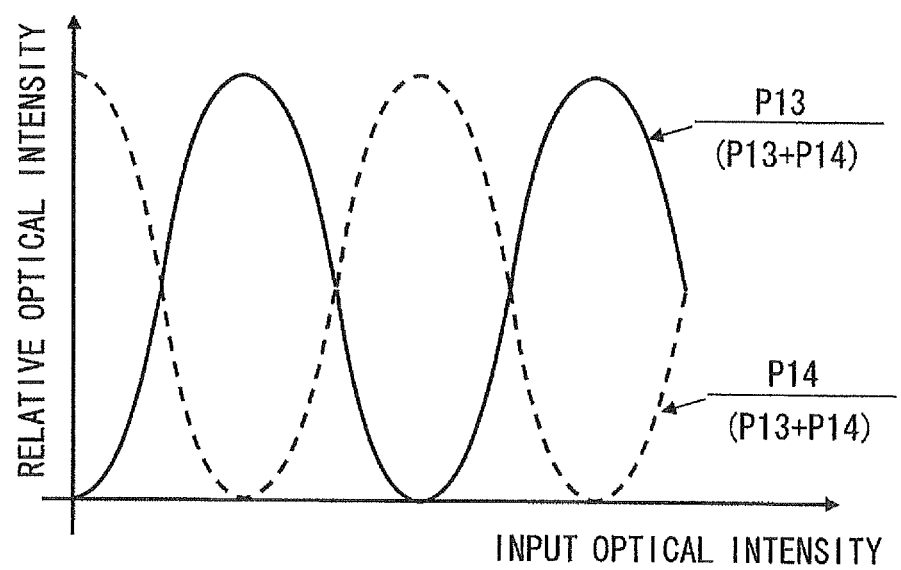
FIG. 5 is a diagram showing relative optical intensity on a cross-section 12 in FIG. 4.

Next, a third exemplary embodiment is explained with reference to FIG. 4. FIG. 4 is a block diagram of an MZ interferometer according to the third exemplary embodiment and is an example of incorporating the optical intensity-to-phase converter in FIG. 1 to the MZ interferometer. The difference from the MZ interferometer in FIG. 2 according to the second exemplary embodiment is that the positional relationship between the port for introducing the signal light and the port for introducing the continuous light is reversed. Specifically, while the continuous light is input to the input ports 2 and 3 in FIG. 2, the signal light is input to the input ports 2 and 3 in FIG. 4. Moreover, while the signal light is input to the input port 4 in FIG. 2, the continuous light is input to the input port 4 in FIG. 4. Also in the third exemplary embodiment, changes in the signal light as in FIG. 5 can be obtained by adjusting each of the optical coupler/splitter 8, the optical intensity adjusters 9a, 9b, and 9c, the optical phase adjusters 10a, 10b, and 10c, and the optical coupler/splitter 11 in a similar method as the second exemplary embodiment. However, in the MZ interferometer of FIG. 4, the greater the intensity of the input signal light is, the greater the sum of the output optical intensity P13 and P14, which is P13+P14. Therefore, the vertical axis in FIG. 5 indicates the relative optical intensity instead of the optical intensity itself.

Fourth Exemplary Embodiment

Figure 6:
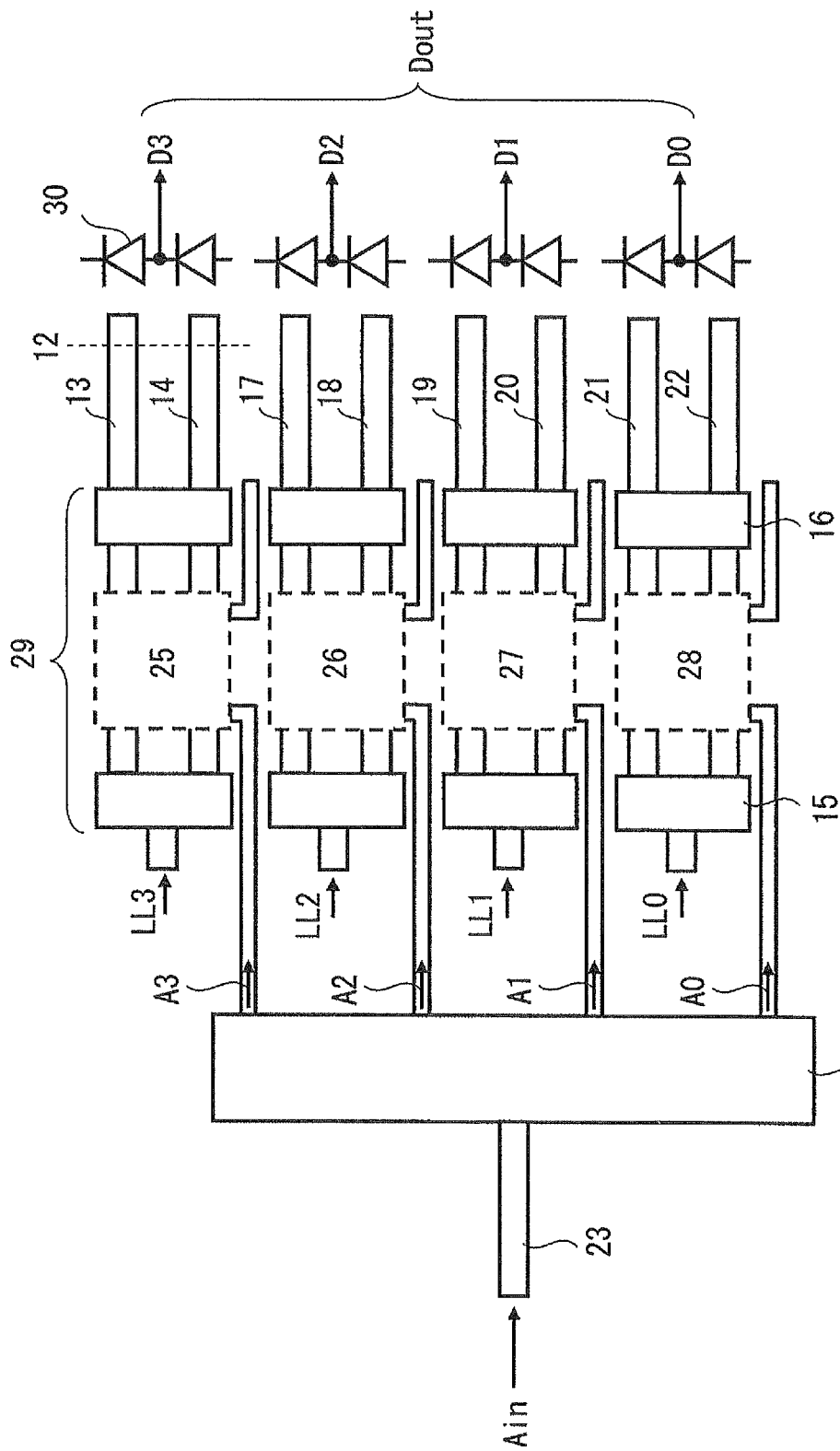
FIG. 6 is a block diagram of an optical A/D converter according to a fourth exemplary embodiment.

Next, a fourth exemplary embodiment is explained with reference to FIG. 6. FIG. 6 is a block diagram of an optical A/D converter according to the fourth exemplary embodiment and is the optical A/D converter including inside the MZ interferometer in FIG. 2. However, an optical splitter 15 of the MZ interferometer shall be an optical coupler/splitter with one input and two outputs instead of the optical coupler/splitter with two inputs and two outputs. In FIG. 6, the MMI waveguide is used as the optical coupler/splitter. The optical A/D converter according to the fourth exemplary embodiment can divide the optical intensity into multiple bits from a light as is to obtain a digital value.

FIG. 6 shows a configuration example of a four-bit optical A/D converter. This optical A/D converter includes an input port 23, an optical splitter 24, MZ interferometers 29, output ports 13, 14, and 17 to 22, and balanced receivers 30.

An analog input signal Ain, which is an optical signal, is input from the input port 23 and is split by the optical splitter 24 into four equivalent analog signals A3, A2, A1, and A0. This number of split corresponds to the number of bits of the optical A/D converter. Each of the lights split by the optical splitter 24 is input to the MZ interferometer 29 through the optical waveguide.

As shown in FIG. 6, the MZ interferometers 29 include four paths that each has one optical splitter 15 and optical coupler/splitter 16. In the optical A/D converter using the MZ interferometer, the MZ interferometers are prepared for the number of bits corresponding to each bit so as to output A/D conversion result at almost the same time. Further, optical modulation regions 25, 26, 27, and 28 are provided between the optical splitter 15 and the optical coupler/splitter 16 in the respective paths. A local light LL3, LL2, LL1, and LL0 is input to each optical splitter 15 and each light is split into two local lights. Four pairs of the local lights LL3, LL2, LL1, and LL1 that are split into two by the optical splitter 15 and analog signals A3, A2, A1, and A0 are respectively input to the optical modulation regions 25, 26, 27, and 28.

The optical modulation regions 25, 26, 27, and 28 here include the optical intensity-to-phase converter 1 in FIG. 1. Each of the optical modulation regions 25, 26, 27, and 28 is configured to include the amount of phase shift necessary for outputting a signal corresponding to each bit of the digital signal.

Lights output from the output port of the optical modulation region 25 mutually interfere in the optical coupler/splitter 16, and then distributed to the output ports 13 and 14. Similarly, lights output from the output port of the optical modulation region 26 mutually interfere in the optical coupler/splitter 16, and then distributed to the output ports 17 and 18. Lights output from the output port of the optical modulation region 27 mutually interfere in the optical coupler/splitter 16, and then distributed to the output ports 19 and 20. Lights output from the output port of the optical modulation region 28 mutually interfere in the optical coupler/splitter 16, and then distributed to the output ports 21 and 22. The optical splitter 15 here is assumed to have one input and two outputs, and the optical coupler/splitter 16 is assumed to have two inputs and two outputs, and are illustrated in FIG. 6.

Next, one pair of lights output from each path of the MZ interferometer is O/E converted by the balanced receiver 30, i.e., converted from an optical signal to an electrical signal. The balanced receiver 30 here is composed of a pair of PDs that are connected in series. Assigning 0 and 1 of a digital signal according to an output from each balanced receiver 30 generates a digital output signal Dout.

Figure 7A:
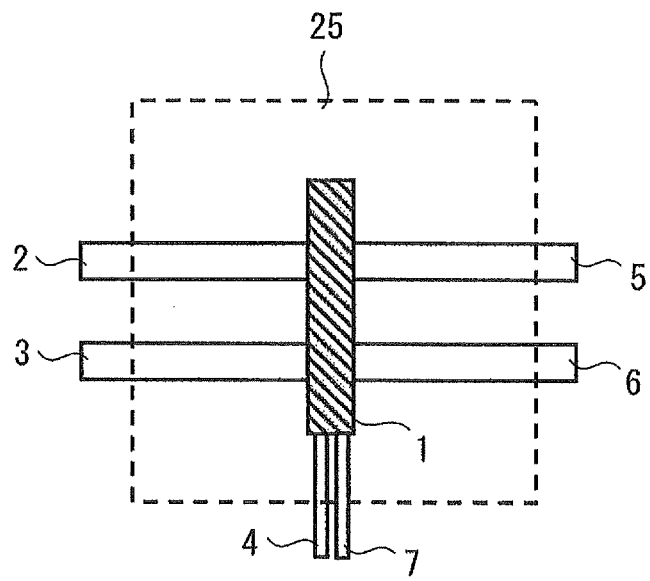
FIG. 7A is a diagram showing a configuration of an optical modulation region 25 in FIG. 6.
Figure 7B:
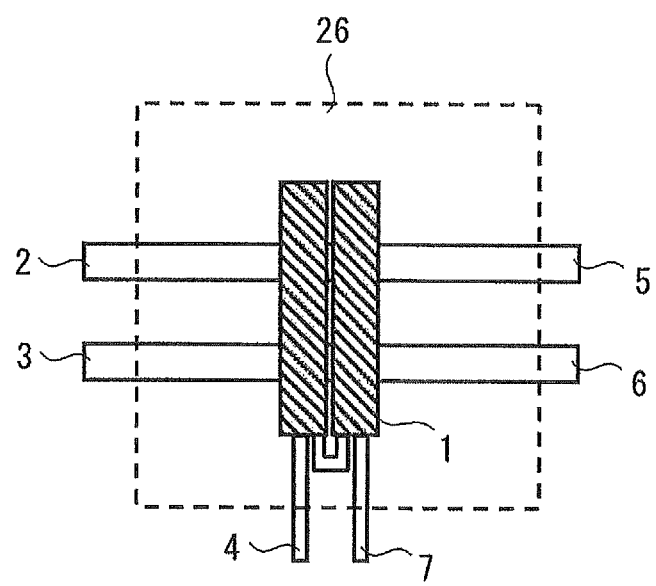
FIG. 7B is a diagram showing a configuration of an optical modulation region 26 in FIG. 6.
Figure 7C:
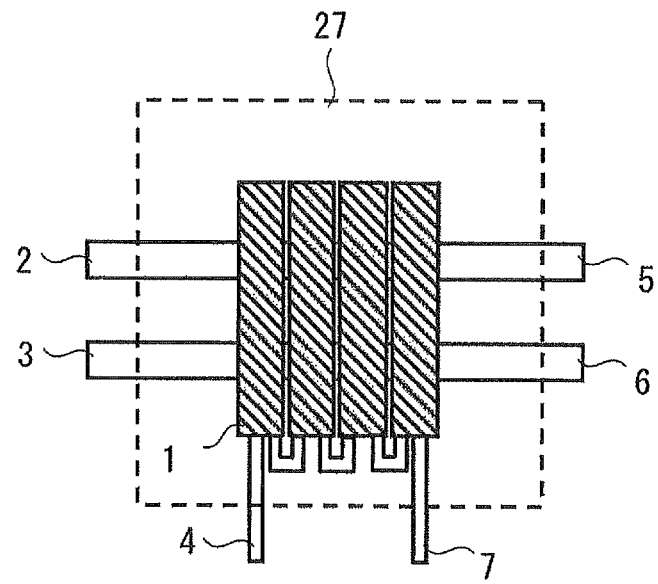
FIG. 7C is a diagram showing a configuration of an optical modulation region 27 in FIG. 6.
Figure 7D:
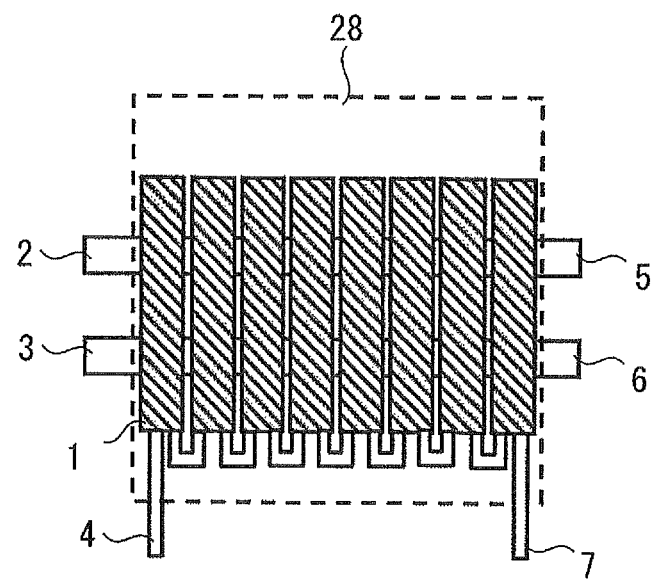
FIG. 7D is a diagram showing a configuration of an optical modulation region 28 in FIG. 6.

Next, an operating principle is explained using FIGS. 7A to 7D. Each MZ interferometer needs to convert the same optical intensity into different delay, i.e., MZ interferometer needs to output different amounts of phase shift (phase rotation) to the same optical intensity. Although it is necessary to design the optical coupler/splitter 8, which is the interacting region, in a manner to cause the amount of phase rotation necessary for each with respect to certain optical signal intensity, to be simple, it is preferable to use the optical intensity-to-phase converter 1 for performing certain unit phase rotation that can be connected in cascade. FIGS. 7A to 7D are diagrams respectively showing details of the optical modulation regions 25 to 28 in FIG. 6. The optical intensity-to-phase converter 1 is provided to the optical modulation regions 25 to 28. The optical intensity-to-phase converter 1 is configured to enable cascade connection. The number of these optical intensity-to-phase converters 1 differs in each of the optical modulation regions 25 to 28. Specifically, there is one in the optical modulation region 25, two in the optical modulation region 26, four in the optical modulation region 27, and eight in the optical modulation region 28. The optical modulation region 25 shown in FIG. 7A corresponds to the MZ interferometer in FIG. 2. As shown in FIG. 7B, when there are two optical intensity-to-phase converters 1 in FIG. 1, the two optical intensity-to-phase converters 1 are connected in cascade. Specifically, three output ports 5 to 7 of the previous stage optical intensity-to-phase converter 1 (see FIG. 1) are respectively connected to the three input ports 2 to 4 of the subsequent stage optical intensity-to-phase converter 1. In general, to create an n-bit optical A/D converter, the number of the optical intensity-to-phase converters 1 may be $2^k (k=0, \ldots, n-1)$ in order from more significant bits to less significant bits.

Moreover, when the optical intensity-to-phase converters 1 are connected in cascade as in the optical modulation regions 26 to 28, the optical intensity adjuster 9c of each optical intensity-to-phase converter 1 is adjusted in advance so that input intensity and output intensity of the signal light will be the same. In addition, the relation between intensity and phases of the local light input to the input port 3 and the local light input to the input port 2 is adjusted to be the same by the optical intensity adjusters 9a and 9b, and the optical phase adjusters 10a and 10b.

In the optical intensity-to-phase converter 1 according to this exemplary embodiment, current values input to the optical couplers/splitters 8 and 11, the width, length, and the like of the MMI waveguide are set so that the phase rotation will be $2\pi$ according to the optical intensity from the minimum optical intensity to the maximum optical intensity. Then, a change in the optical intensity from the minimum optical intensity to the maximum optical intensity causes the phase rotation of $2\pi$ in the light modulation region 25, $4\pi$ in the light modulation region 26, $8\pi$ in the light modulation region 27, and $16\pi$ in the light modulation region 2.

Figure 8:
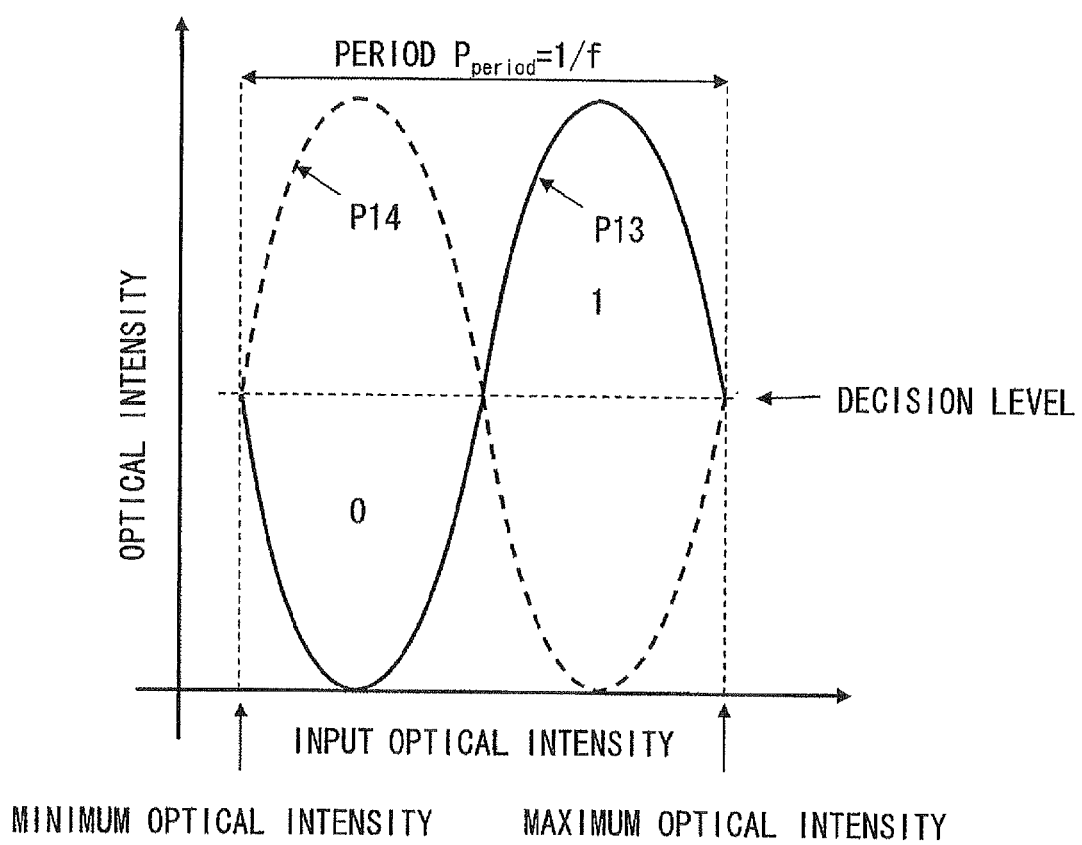
FIG. 8 is a graph showing relative intensity of an optical output on a cross-section 12 in FIG. 6.

Therefore, assuming that the optical intensity of the output port 13 is P13 and the optical intensity of the output port 14 is P14, they change as shown in FIG. 8. The horizontal axis in FIG. 8 indicates the input optical intensity, and the vertical axis indicates the optical intensity. FIG. 8 here shows the optical intensity on the cross-section 12 in FIG. 6.

Then, the intensity of the optical intensity P13 and P14 is compared and an evaluation of 0 or 1 should be performed according to which one is greater. Specifically, as the balanced receiver 30 can detect the difference in the output by combining the two PDs, a digital value can be obtained using a comparator.

This ratio is set so that the phase rotation will be $2\pi$ according to the optical intensity from the minimum optical intensity to the maximum optical intensity in the light modulation region 25. Therefore, the repetition period $P_{period}=1/f$ (f is a repetition frequency) will be one period according to the optical intensity from the minimum optical intensity to the maximum optical intensity.

Similarly, the light modulation regions 26, 27, and 28 are configured so that the phase rotation will be $4\pi$, $8\pi$, and $16\pi$ respectively according to the optical intensity up to the maximum optical intensity. Accordingly, when the repetition frequency in the optical modulation region 25 is f, the output optical intensity repetition frequency from the output ports 17 and 18 will be 2×f. Similarly, the repetition frequency of the output optical intensity from the output ports 19 and 20 will be 4×f. The repetition frequency of the output optical intensity from the output ports 21 and 22 will be 8×f.

Figure 9:
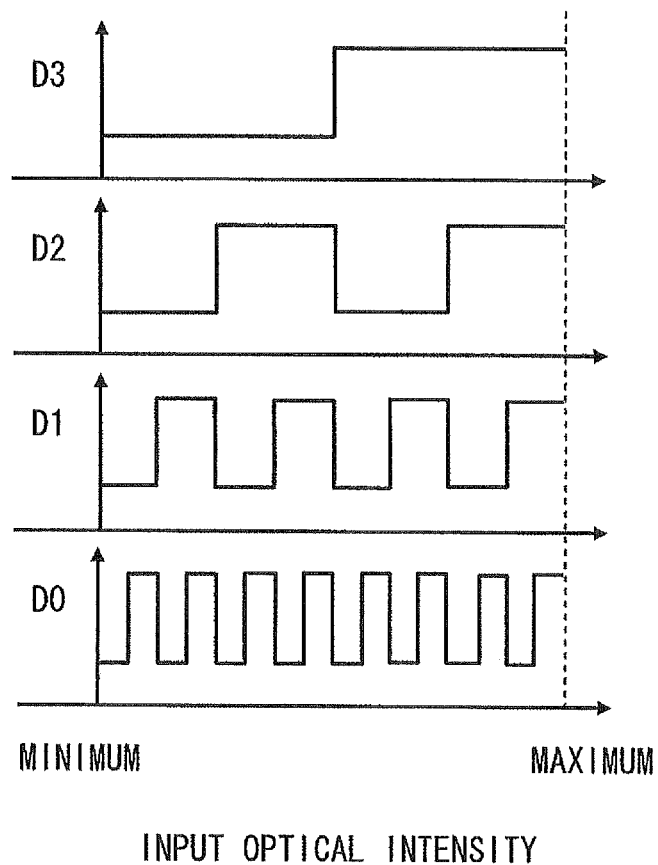
FIG. 9 is a diagram showing digital signals depending on input optical intensity output from the optical A/D converter according to the fourth exemplary embodiment.

Each of outputs from the optical modulation regions 25 to 28 is input to the balanced receivers 30, and digital signals D3, D2, D1, and D0 corresponding to the analog signals A3, A2, A1 and A0 are output. Specifically, the digital signals D3, D2, D1, and D0 as shown in FIG. 9 can be obtained according to the input optical intensity. In other words, the optical intensity of the analog input signal is converted into the digital signal.

Fifth Exemplary Embodiment

Figure 10:
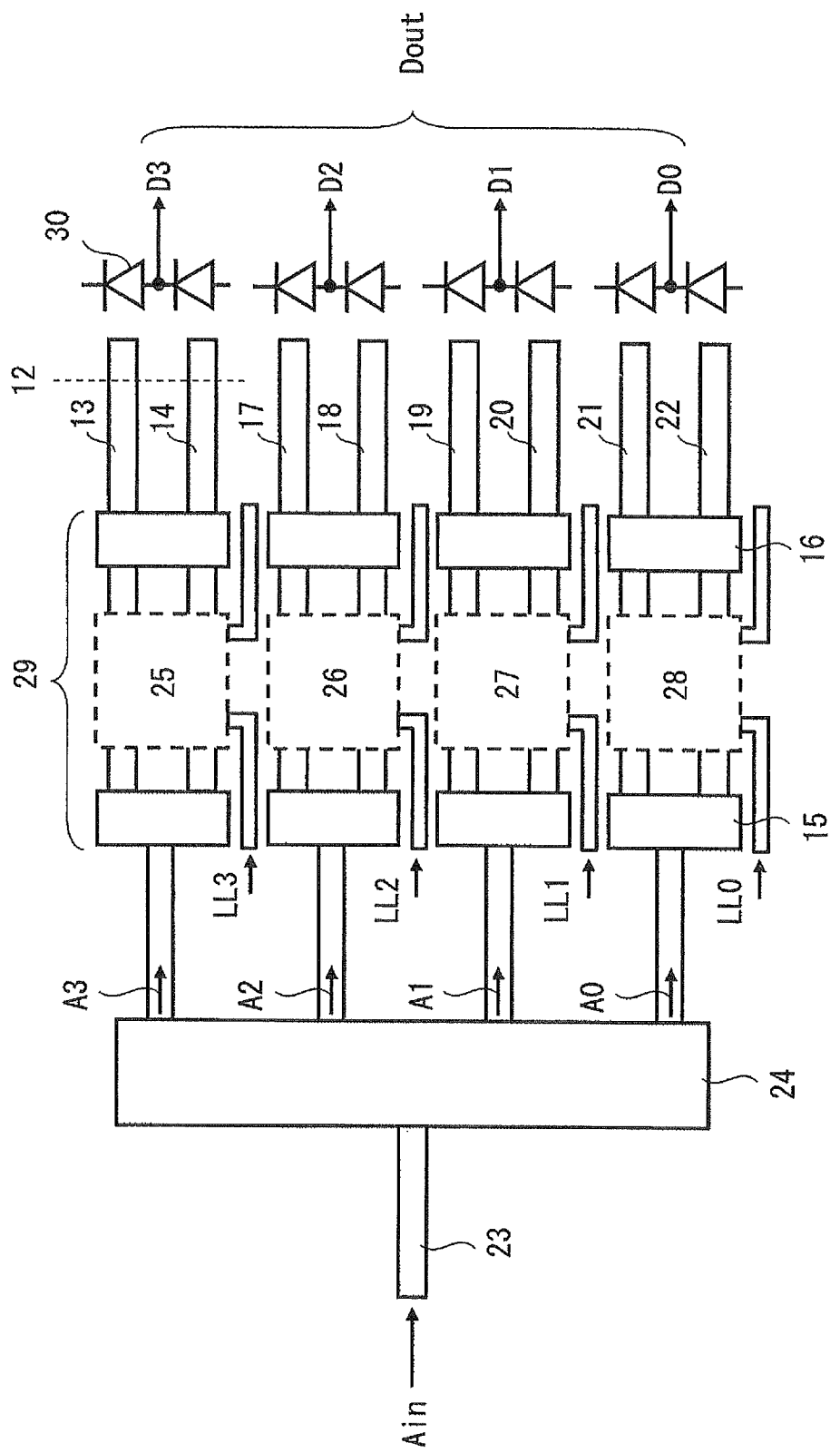
FIG. 10 is a block diagram of an optical A/D converter according to a fifth exemplary embodiment.
Figure 11A:
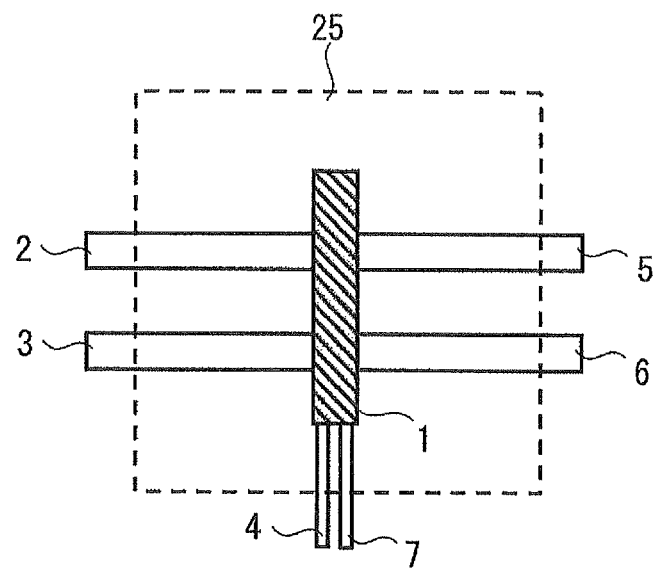
FIG. 11A is a diagram showing a configuration of an optical modulation region 25 in FIG. 10 corresponding to a digital code in FIG. 12.
Figure 11B:
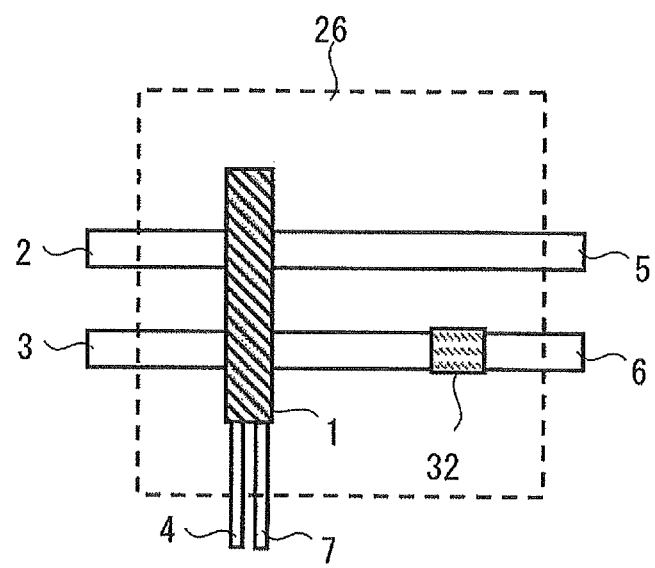
FIG. 11B is a diagram showing a configuration of an optical modulation region 26 in FIG. 10 corresponding to a digital code in FIG. 12.
Figure 11C:
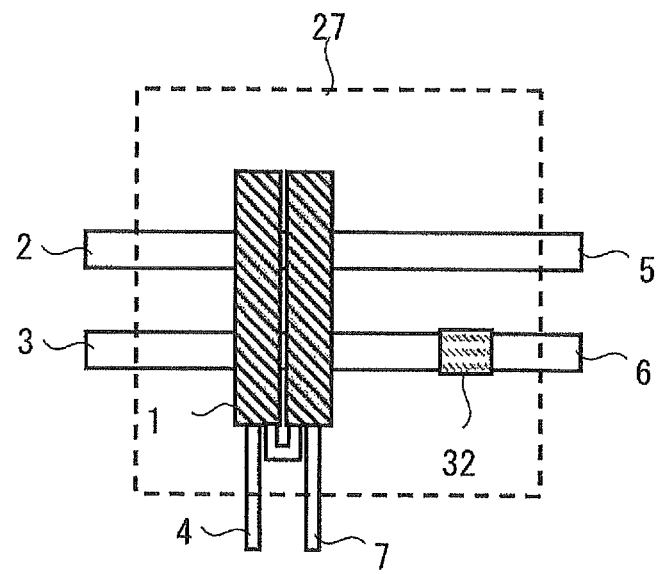
FIG. 11C is a diagram showing a configuration of an optical modulation region 27 in FIG. 10 corresponding to a digital code in FIG. 12.
Figure 11D:
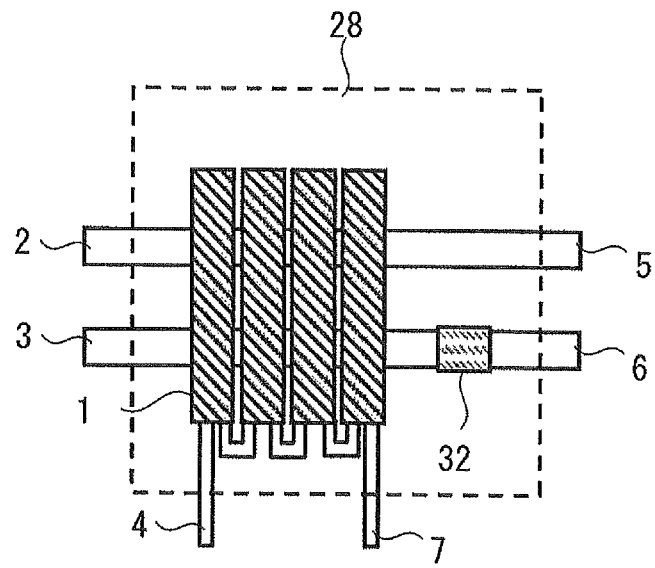
FIG. 11D is a diagram showing a configuration of an optical modulation region 28 in FIG. 10 corresponding to a digital code in FIG. 12.

Next, a fifth exemplary embodiment is explained with reference to FIG. 10. FIG. 10 is a block diagram of an optical A/D converter according to the fifth exemplary embodiment and is the optical A/D converter including inside the MZ interferometer in FIG. 4. However, the optical splitter 15 of the MZ interferometer is an MMI waveguide with one input and two outputs instead of the MMI waveguide with two inputs and two outputs.

FIG. 10 shows a configuration example of a four-bit optical A/D converter. Basic configuration is similar to that of the fourth exemplary embodiment. The difference from FIG. 6 is the point that among the input lights to the MZ interferometer 29, each of the analog signals A3, A2, A1, and A0 are split into two and introduced to the input ports 2 and 3 of the first stage optical intensity-to-phase converter 1 in each of the optical modulation regions 25 to 28, and the local light (LL0, LL1, LL2, and LL3) is introduced to the input port 4 of the optical intensity-to-phase converter 1.

The function of the optical modulation regions 25 to 28 is similar to that of the optical modulation regions 25 to 28 in FIG. 6. As shown in FIGS. 11A to 11D, the optical modulation regions 25 to 28 use the optical intensity-to-phase converter 1, which can be connected in cascade and performs certain unit phase rotation, and respectively include $2^0=1$, $2^1=2$, $2^2=4$, and $2^3=8$ number of optical intensity-to-phase converters 1. Such a configuration is similar to the one in the fourth exemplary embodiment and the method of determining the number of inclusion is also similar.

In the optical A/D converter in FIG. 10, the local light LL is introduced only to the optical coupler/splitter 8 of the optical intensity-to-phase converter 1, and therefore it is possible to create the states with different optical intensity inside the optical coupler/splitter 8 under the same signal light change. Accordingly, delay can be given between the signal lights that are input to the input ports 2 and 3 using the difference between the self phase modulation generated in the optical coupler/splitter 11 and the cross-phase modulation generated in the optical coupler/splitter 8. The digital signals as shown in FIG. 9 can be obtained in this way.

Figure 12:
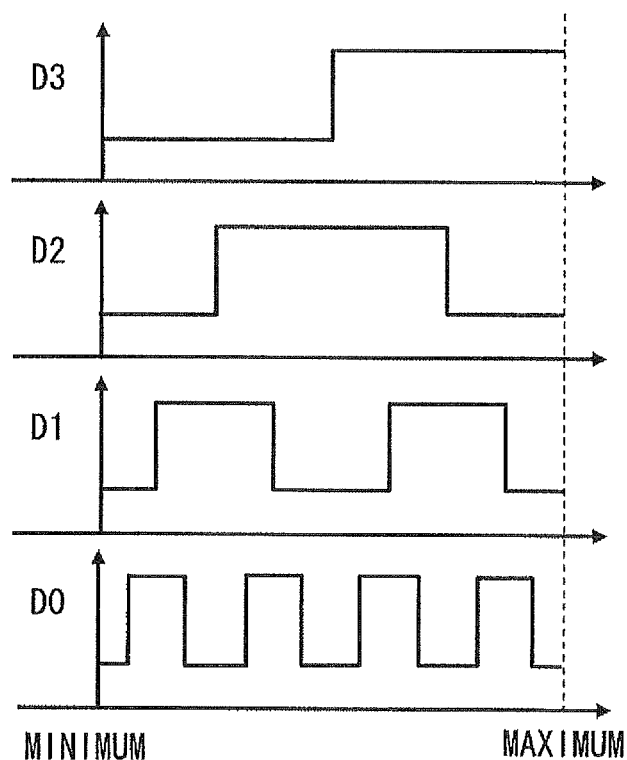
FIG. 12 is a diagram showing digital signals different from FIG. 5 that can be output in the fourth and fifth exemplary embodiments.

Note that the fourth and fifth exemplary embodiments are configured based on the binary code. In practical, the configurations of the optical modulation regions 25 to 28 are set appropriately according to the format of the digital signal code. For example, the optical modulation regions 25 to 28 according to the fourth and fifth exemplary embodiment may be configured as in the optical modulation regions 25 to 28 shown in FIGS. 11A to 11D, and then the codes shown in FIG. 12 (Gray codes) can be output. The optical phase adjuster 32 of FIGS. 11B to 11D rotates the phase by π/2 without changing the intensity. In general, to create an n-bit optical A/D converter, the number of the optical intensity-to-phase converters 1 may be 2^k(k=0, . . . , n−1) in order from more significant bits to less significant bits.

Note that instead of providing the optical phase adjuster 32, the adjustment may be made using the optical phase adjuster 10a or 10b of the last stage optical intensity-to-phase converter 1 included in the optical modulation regions 25 to 28. Moreover, it is possible to eliminate the optical phase adjuster 32 by changing the optical splitter 15, which is located at the bit where the optical phase adjuster 32 is added among the optical splitters 15 provided to each MZ interferometer shown in FIGS. 6 and 10, from the MMI waveguide with one input and two outputs to the MMI waveguide with two inputs and two outputs.

Note that the MZ interferometer including an optical intensity-to-phase modulator according to the above exemplary embodiment is not limited to incorporation into the optical A/D converter. The optical intensity-to-phase converter reflects the intensity of the signal light to the phase information of a continuous light, and when applied to the structure of the MZ interferometer, it is converted into an intensity signal. Therefore, in general, when the wavelength of the signal light differs from the wavelength of the continuous light, it functions as a wavelength converter. The application to such a use is also possible.

Note that it is needless to say that the above exemplary embodiments can be combined within the range not contradicting the contents thereof. Although the abovementioned exemplary embodiments and modifications explained the structure of each part in detail, the structure can be modified in the range satisfying the present invention. Using the optical intensity-to-phase converter realized by the present invention realizes a high speed and low power optical A/D converter, therefore can be used for an optical demodulation circuit using this optical A/D converter taking advantages such as high speed and low power. Specifically, the optical A/D converter of the present invention can be included in a coherent detection circuit and an optical direct detection circuit.

Although the present invention has been explained with reference to the exemplary embodiments, the present invention is not limited by above. Various modifications that can be understood by a person skilled in the art can be made to the configurations and details of the present invention within the scope of the invention.

The present application claims priority rights of and is based on Japanese Patent Application No. 2010-115545 filed on May 19, 2010 in the Japanese Patent Office, the entire contents of which are hereby incorporated by reference.

INDUSTRIAL APPLICABILITY

The technique according to the present invention can be used to an optical intensity-to-phase converter, a Mach-Zehnder interferometer and an optical A/D converter using thereof, and an optical intensity-to-phase converter.

REFERENCE SIGNS LIST

1 OPTICAL INTENSITY-TO-PHASE CONVERTER
2 to 4, and 23 INPUT PORT
5 to 7, 13, 14, 17 TO 22 OUTPUT PORT
8, 11, and 16 OPTICAL COUPLER/SPLITTER
9 OPTICAL INTENSITY ADJUSTER
10 and 32 OPTICAL PHASE ADJUSTER
12 CROSS-SECTION
15 and 24 OPTICAL SPLITTER
25 to 28 OPTICAL MODULATION REGION
29 MZ INTERFEROMETER
30 BALANCED RECEIVER

The invention claimed is:

1. An optical intensity-to-phase converter comprising:
first and second waveguides, a first input light being input to the first and second waveguides;
a third waveguide, a second input light being input to the third waveguide;
a first interaction region that is provided in common on the second and third waveguides, the first and second input lights being multiplexed and interacting in the interaction region; and
a second interaction region that is provided on the first waveguide, with the same size as that of the first interaction region, the first input light being input to the second interaction region and the second input light not being input to the second interaction region,
wherein the optical intensity-to-phase converter provides delay to output lights output from the first and second waveguides based on intensity of the first or second input light.

2. The optical intensity-to-phase converter according to claim 1, wherein the interaction region is an MMI waveguide.

3. The optical intensity-to-phase converter according to claim 1, further comprising an optical intensity adjuster and an optical phase adjuster on the second waveguide of an output side of the first interaction region.

4. The optical intensity-to-phase converter according to claim 1, further comprising the optical intensity adjuster and the optical phase adjuster on the third waveguide of the output side of the first interaction region.

5. The optical intensity-to-phase converter according claim 1, further comprising the optical intensity adjuster and the optical phase adjuster on the first waveguide.

6. A Mach-Zehnder interferometer comprising:
the optical intensity-to-phase converter according to claim 1;
a splitter that splits the first input light into the first and second waveguides; and
a coupler/splitter that multiplexes and splits the output lights output from the first and second waveguides.

7. The Mach-Zehnder interferometer according to claim 6, wherein a plurality of the optical intensity-to-phase converters are connected in series.

8. An optical A/D converter comprising N (N is an natural number) number of the Mach-Zehnder interferometers according to claim 6, wherein the Mach-Zehnder interferometer outputs an N-bit digital signal according to intensity of first input light.

9. The optical intensity-to-phase converter according to claim 1, wherein the second interaction region having a same structure including a same size and a same width as that of the first interaction region,
wherein the second interaction region adjusts an intensity of the first input light via the first waveguide exclusive of the second input light.

10. A construction method of an optical intensity-to-phase converter comprising:
providing first and second waveguides, a first input light being input to the first and second waveguides;

providing a third waveguide, a second input light being input to the third waveguide;

providing a first interaction region in common to the second and third waveguides, the first and second input lights being multiplexed and interacting in the interaction region;

providing a second interaction region on the first waveguide, with the same size as that of the first interaction region, the first input light being input to the second interaction region and the second input light not being input to the second interaction region; and providing delay to output lights output from the first and second waveguides based on intensity of the first or second input light.

11. The construction method according to claim 10, wherein when the first input light via the second waveguide and the second input light via the third waveguide undergoes optical amplification by the first interaction region and an intensity of the first and second input lights changes, the second interaction region adjusts the intensity of the first input light via the first waveguide.

\* \* \* \* \*